(12) United States Patent
Chen et al.

(10) Patent No.: US 12,094,644 B2
(45) Date of Patent: Sep. 17, 2024

(54) ELECTRONIC STRUCTURE HAVING A TRANSFORMER

(71) Applicant: CYNTEC CO., LTD., Hsinchu (TW)

(72) Inventors: Da-Jung Chen, Taoyuan (TW);
Chi-Feng Huang, Taipei (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 18/132,365

(22) Filed: Apr. 8, 2023

(65) Prior Publication Data
US 2023/0245818 A1    Aug. 3, 2023

Related U.S. Application Data

(63) Continuation of application No. 16/870,969, filed on May 10, 2020, now Pat. No. 11,651,890.

(60) Provisional application No. 62/983,765, filed on Mar. 2, 2020.

(51) Int. Cl.
| | |
|---|---|
| *H01F 27/32* | (2006.01) |
| *H01F 27/24* | (2006.01) |
| *H01F 27/28* | (2006.01) |
| *H01F 27/29* | (2006.01) |
| *H05K 1/16* | (2006.01) |

(52) U.S. Cl.
CPC .......... *H01F 27/327* (2013.01); *H01F 27/24* (2013.01); *H01F 27/2804* (2013.01); *H01F 27/292* (2013.01); *H05K 1/165* (2013.01)

(58) Field of Classification Search
CPC ...... H01F 27/327; H01F 27/24; H01F 27/292; H01F 27/2804; H05K 1/165
See application file for complete search history.

(56) References Cited

U.S. PATENT DOCUMENTS

| | | | | |
|---|---|---|---|---|
| 7,952,457 | B2 * | 5/2011 | Yamaguchi | H01F 27/306 336/200 |
| 8,164,408 | B2 * | 4/2012 | Kim | H01F 27/306 336/200 |
| 8,477,005 | B2 * | 7/2013 | Tseng | H01F 27/292 336/198 |
| 10,340,074 | B2 * | 7/2019 | Chiu | H01F 27/24 |
| 11,322,286 | B2 * | 5/2022 | Elferich | H01F 27/324 |
| 11,651,890 | B2 * | 5/2023 | Chen | H05K 3/284 336/200 |
| 2012/0169446 | A1 * | 7/2012 | Tseng | H05K 1/182 336/192 |
| 2019/0103210 | A1 * | 4/2019 | Elferich | H05K 1/165 |

* cited by examiner

*Primary Examiner* — Richard V Muralidar
(74) *Attorney, Agent, or Firm* — Min-Lee Teng

(57) ABSTRACT

An electronic structure comprising: a circuit board, wherein electronic devices and a transformer are disposed on the circuit board, wherein the transformer comprises a first coil, a second coil, and a magnetic body comprising a pillar with at least one portion of the pillar being disposed in a through-opening of the circuit board, wherein the first coil is wound around an upper portion of the pillar and the second coil is wound around a lower portion of the pillar for forming the transformer.

20 Claims, 10 Drawing Sheets ary of the invention

ELECTRONIC STRUCTURE HAVING A TRANSFORMER

CROSS-REFERENCES TO RELATED APPLICATIONS

The present application is a continuation of U.S. application Ser. No. 16/870,969 filed on May 10, 2020, which claims the benefit of U.S. Provisional Application Ser. No. 62/983,765 filed on Mar. 2, 2020, each of the above-mentioned applications is hereby incorporated by reference herein and made a part of the specification.

BACKGROUND OF THE INVENTION

I. Field of the Invention

The invention relates to an electronic structure and, in particular, to an electronic structure with a transformer.

II. Description of the Related Art

Electronic structures, such as a power supply module with different power domains, usually need a transformer to decouple voltages in different power domains so that the electronic devices in one power domain will not be affected by the voltages of the other power domain in the power supply module. However, a conventional power supply module with a transformer requires a large space for accommodating the transformer and the electronic devices in the power supply module. Besides, the design process of the electronic structure, such as the power supply module, is complicated and costly. Furthermore, it is easier to cause abnormal voltages in the power supply module due to the short distance between the transformer and the electronic devices in the power supply module as the size of the power supply module becomes smaller and smaller.

Accordingly, there is a demand for a better solution to resolve the aforementioned issues.

SUMMARY OF THE INVENTION

One objective of the present invention is to provide an electronic structure comprising a pillar with at least one portion of the pillar being disposed in a through-opening of a circuit board, wherein two coils are wound around the pillar for forming a transformer.

One objective of the present invention is to provide an electronic structure with a smaller size by using conductive patterns of a circuit board to form a first coil and a second coil of a transformer.

One objective of the present invention is to provide a transformer by using a flexible printed circuit board (FPCB) to form a first coil and a second coil of a transformer to reduce the size of the transformer.

In one embodiment, an electronic structure is disclosed, wherein the electronic structure comprises: a circuit board, wherein a plurality of electronic devices and a transformer are disposed on the circuit board, wherein the transformer comprises a first coil, a second coil, and a magnetic body, wherein the magnetic body comprises a first portion disposed in a first hollow space of the first coil and a second portion in a second hollow space of the second coil for forming the transformer.

In one embodiment, a molding body encapsulates at least one portion of the outer surface of the first coil, at least one portion of the outer surface of the second coil, and the plurality of electronic devices for electrically isolating the plurality of electronic devices from the transformer.

In one embodiment, the molding body comprises a resin.

In one embodiment, the molding body comprises epoxy.

In one embodiment, the molding body encapsulates the entire outer surface of the first coil.

In one embodiment, the molding body encapsulates the entire outer surface of the second coil.

In one embodiment, the molding body further encapsulates at least one portion of the outer surface of the magnetic body.

In one embodiment, the molding body further encapsulates the entire outer surface of the magnetic body.

In one embodiment, each of the first coil and the second coil is formed by corresponding conductive patterns of a plurality of conductive layers of the circuit board.

In one embodiment, the first coil comprises a first plurality of conductive patterns on the top surface of the circuit board, and the second coil comprises a second plurality of conductive patterns on the top surface of the circuit board, wherein the molding body encapsulates the first plurality of conductive patterns and the second plurality of conductive patterns.

In one embodiment, the first coil comprises a first plurality of conductive patterns on the top surface of the circuit board and a second plurality of conductive patterns on the bottom surface of the circuit board, wherein the molding body encapsulates the first plurality of conductive patterns and the second plurality of conductive patterns.

In one embodiment, the first coil comprises a first plurality of conductive patterns on the top surface of the circuit board, a second plurality of conductive patterns on a middle layer of the circuit board and third plurality of conductive patterns on the bottom surface of the circuit board, wherein the molding body encapsulates the first plurality of conductive patterns, the second plurality of conductive patterns and the third plurality of conductive patterns.

In one embodiment, the circuit board further comprises a plurality of conductive patterns on the circuit board to electrically connect the first coil and an electronic device of the plurality of the electronic devices.

In one embodiment, the circuit board comprises a BT (Bismaleimide Triazine) substrate, metallic substrate or ceramic substrate.

In one embodiment, the circuit board is a multilayer circuit board, wherein the first coil comprises corresponding conductive patterns on each layer of the multilayer circuit board, wherein the molding body encapsulates the corresponding conductive patterns on each layer of the multilayer circuit board.

In one embodiment, the second coil comprises a second plurality of conductive patterns on each layer of the multilayer circuit board, wherein the molding body encapsulates the first plurality of conductive patterns and the second plurality of conductive patterns.

In one embodiment, the plurality of electronic devices are embedded inside the multilayer circuit board.

In one embodiment of the present invention, a high-density circuit design can be obtained by embedding the plurality of electronic devices inside the circuit board, wherein active components or passive components can be embedded inside the circuit board; the circuit board can be a single-sided circuit or a double-sided circuit design, wherein the embedded design can effectively shorten the conductive path between components to achieve higher efficiency, smaller size and higher density of the circuit design.

In one embodiment, each of the first coil and the second coil is formed by a conductive wire.

In one embodiment, one portion of the first coil is disposed above the circuit board and another portion of the first coil is disposed below the circuit board.

In one embodiment, the first coil is disposed above the circuit board and a third coil is disposed below the circuit board, wherein the first coil is electrically connected to the third coil by a conductive pattern of the circuit board.

In one embodiment, each of the first coil and the second coil is disposed in a through-opening of the circuit board.

In one embodiment, each of the first coil and the second coil is disposed in a recess of the circuit board.

In one embodiment, each of the first coil and the second coil is disposed in a recess of the circuit board.

In one embodiment, the plurality of electronic devices comprise an IC.

In one embodiment, an electronic structure is disclosed, the electronic structure comprising: a circuit board, wherein a plurality of electronic devices and a transformer are disposed on the circuit board, wherein the transformer comprises a first coil, a second coil, and a magnetic body, wherein the magnetic body comprises a first portion disposed in a first hollow space of the first coil and a second portion in a second hollow space of the second coil for forming the transformer, wherein each of the first coil and the second coil is formed by corresponding conductive patterns of a plurality of conductive layers of the circuit board.

In one embodiment, an electronic structure is disclosed, the electronic structure comprising: a first coil, a second coil, and a magnetic body, wherein the magnetic body comprises a first portion disposed in a first hollow space of the first coil and a second portion in a second hollow space of the second coil for forming the transformer, wherein each of the first coil and the second coil is formed on a flexible printed circuit board.

In one embodiment, a plurality of electronic devices are disposed on the flexible printed circuit board.

In one embodiment, each of the first coil and the second coil is formed by corresponding conductive patterns of the flexible printed circuit board.

In one embodiment, each of the first coil and the second coil is formed by a corresponding conducting wire.

In one embodiment, a molding body comprising an insulating material to encapsulate at least one portion of the first coil, at least one portion of the second coil, and the plurality of electronic devices disposed on the flexible printed circuit board.

In one embodiment, the first coil comprises a first plurality of conductive patterns on the top surface of the flexible printed circuit board and a second plurality of conductive patterns on the bottom surface of the flexible printed circuit board, wherein the first magnetic molding body encapsulates the first plurality of conductive patterns and the second plurality of conductive patterns to form the transformer.

In one embodiment, a transformer is disclosed, the transformer comprising: a flexible printed circuit board, wherein a first coil and a second coil are formed by a plurality of conductive patterns of the flexible printed circuit board, wherein a magnetic body comprises a first portion disposed in a first hollow space of the first coil and a second portion in a second hollow space of the second coil for forming the transformer.

In one embodiment, the first coil comprises first plurality of conductive patterns on the top surface of the flexible printed circuit board and second plurality of conductive patterns on the bottom surface of the flexible printed circuit board, wherein the first magnetic molding body encapsulates the first plurality of conductive patterns and the second plurality of conductive patterns to form the transformer.

BRIEF DESCRIPTION OF THE DRAWINGS

The present invention can be more fully understood by reading the subsequent description and examples with references made to the accompanying drawings, wherein.

DETAILED DESCRIPTION OF THE INVENTION

Figures 1, 2:
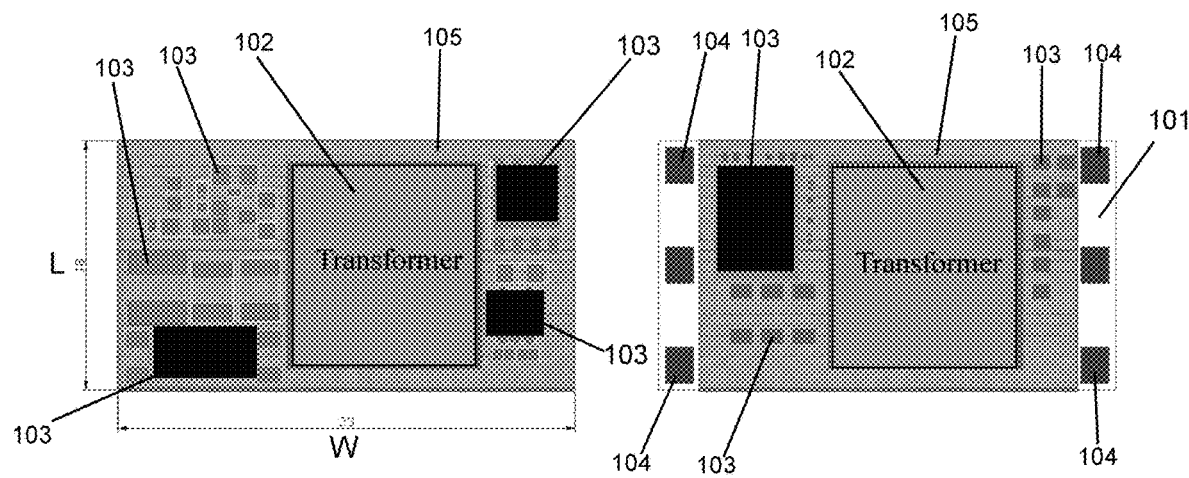
FIG. 1 is a top view of an electronic structure according to one embodiment of the invention.
FIG. 2 is a bottom view of the electronic structure of FIG. 1 according to one embodiment of the invention.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. Besides, the present disclosure may repeat reference numerals and/or letters in the various examples. This repetition is for simplicity and clarity and does not in itself dictate a relationship between the various embodiments and/or configurations discussed.

Figure 3:
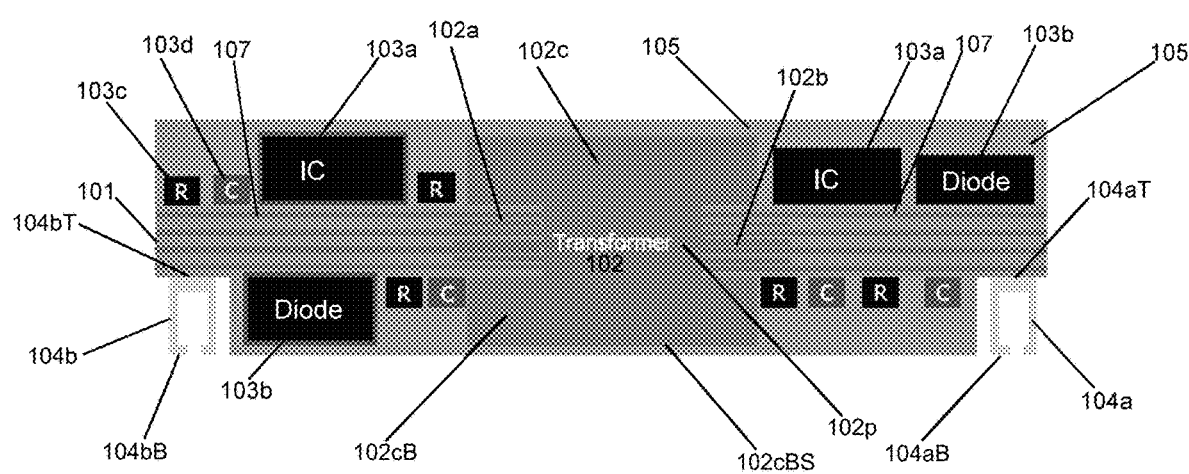
FIG. 3 is a cross-sectional side view of the electronic structure according to one embodiment of the invention.

FIG. 1 is a top view of an electronic structure according to one embodiment of the invention. FIG. 2 is a bottom view of the electronic structure of FIG. 1. FIG. 3 is a cross-sectional side view of the electronic structure of FIG. 1. As shown in FIG. 1-3, wherein the electronic structure comprises: a circuit board 101, wherein a plurality of electronic devices 103 and a transformer 102 are disposed on the circuit board 101, wherein the transformer 102 comprises a first coil 102a, a second coil 102b, and a magnetic body 102c, wherein the magnetic body 102c comprises a first portion disposed in a first hollow space of the first coil 102a and a second portion in a second hollow space of the second coil 102b for forming the transformer 102, wherein a molding body 105 encapsulates at least one portion of the outer surface of the first coil 102a, at least one portion of the outer surface of the second coil 102b and the plurality of electronic devices 103, wherein the molding body 105 is capable of electrically isolating the plurality of electronic devices 103 from the transformer 102 and increase the structural strength of the electronic structure.

In one embodiment, the molding body 105 comprises a resin

In one embodiment, the molding body 105 comprises epoxy.

In one embodiment, the molding body 105 is integrally formed and has a unitary body.

In one embodiment, the molding body 105 encapsulates the entire outer surface of the first coil 102a.

In one embodiment, the molding body 105 encapsulates the entire outer surface of the second coil 102b.

In one embodiment, the molding body 105 further encapsulates at least one portion of the outer surface of the magnetic body.

In one embodiment, the molding body 105 further encapsulates the entire outer surface of the magnetic body.

In one embodiment, each of the first coil 102a and the second coil 102b is formed by corresponding conductive patterns 107 of a plurality of conductive layers of the circuit board 101, as shown in FIG. 3.

In one embodiment, the circuit board 101 is a single side PCB, wherein the conductive patterns are in the top or the bottom surface of the circuit board.

In one embodiment, the circuit board 101 is a double side PCB, wherein the conductive patterns are in the top and the bottom surface of the circuit board.

In one embodiment, the circuit board 101 is a multilayer PCB wherein the conductive patterns are on the top surface, at least one middle conductive layer, and the bottom surface of the circuit board.

In one embodiment, at least one portion of the magnetic body 102c is disposed in a through-opening of the circuit board.

In one embodiment, the first coil 102a comprises a first plurality of conductive patterns on the top surface of the circuit board 101, and the second coil 102b comprises a second plurality of conductive patterns on the top surface of the circuit board 101, wherein the molding body 105 encapsulates the first plurality of conductive patterns and the second plurality of conductive patterns.

In one embodiment, the first coil 102a comprises a first plurality of conductive patterns on the top surface of the circuit board 101 and a second plurality of conductive patterns on the bottom surface of the circuit board 101, wherein the molding body 105 encapsulates the first plurality of conductive patterns and the second plurality of conductive patterns.

In one embodiment, the first coil 102a comprises a first plurality of conductive patterns on the top surface of the circuit board 101, a second plurality of conductive patterns on a middle layer of the circuit board 101, and a third plurality of conductive patterns on the bottom surface of the circuit board 101, wherein the molding body 105 encapsulates the first plurality of conductive patterns, the second plurality of conductive patterns and the third plurality of conductive patterns.

In one embodiment, the circuit board 101 further comprises a plurality of conductive patterns to electrically connect the first coil 102a and at least one electronic device of the plurality of the electronic devices 103.

In one embodiment, the circuit board comprises a BT (Bismaleimide Triazine) substrate, metallic substrate or ceramic substrate.

In one embodiment, the width W of the circuit board 101 is 33 mm and the length L of the circuit board 101 is 18 mm, and the size of the circuit board is reduced 34% compared with the conventional power supply module.

In one embodiment, the circuit board 101 is a multilayer circuit board, wherein the first coil 102a comprises corresponding conductive patterns on each layer of the multilayer circuit board, wherein the molding body 105 encapsulates the corresponding conductive patterns on each layer of the multilayer circuit board.

In one embodiment, the second coil 102b comprises a second plurality of conductive patterns on each layer of the multilayer circuit board, wherein the molding body 105 encapsulates the first plurality of conductive patterns and the second plurality of conductive patterns.

In one embodiment, the plurality of electronic devices 103 are embedded inside the circuit board 101.

In one embodiment, the circuit board 101 is a multilayer circuit board, wherein the plurality of electronic devices 103 are embedded inside the multilayer circuit board.

Figure 7:
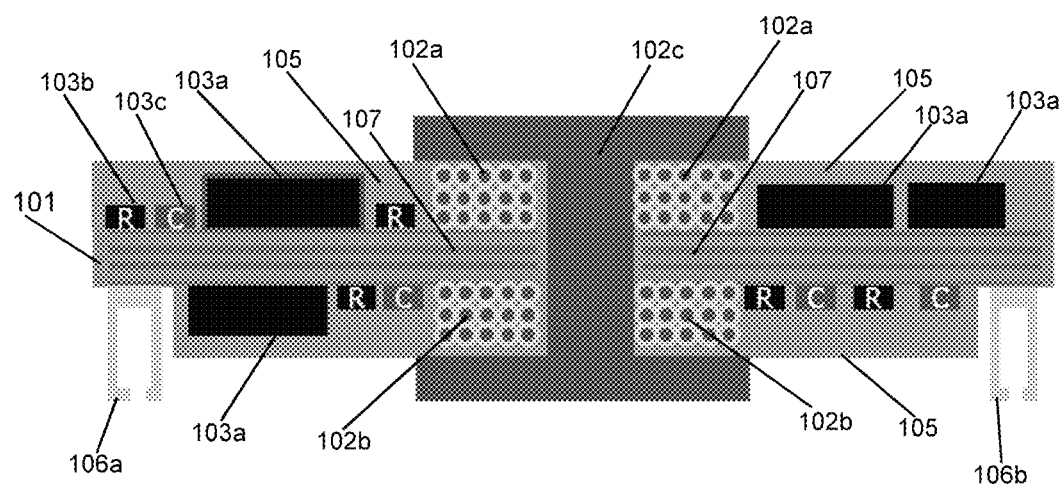
FIG. 7 is a cross-sectional side view of the electronic structure according to one embodiment of the invention.

In one embodiment, each of the first coil 102a and the second coil 102b is formed by a discrete conducting wire, as shown in FIG. 7.

In one embodiment, the circuit board 101 comprises conductive patterns 107 on the circuit board 101 to electrically connect the first coil 102a, the second coil 102b and the plurality of the electronic devices 103.

In one embodiment, one portion of the first coil 102a is disposed above the top surface of the circuit board 101 and another portion of the first coil 102a is disposed below the bottom surface of the circuit board 101.

In one embodiment, the first coil 102a is disposed above the circuit board and a third coil is disposed below the circuit board 101, wherein the first coil 102a is electrically connected to the third coil by a conductive pattern of the circuit board 101. In one embodiment, each of the first coil 102a and the third coil is formed by a corresponding conductive wire. In one embodiment, each of the first coil 102a and the third coil is formed by a corresponding insulated conductive wire, such as an enameled wire.

In one embodiment, the magnetic body 102c is disposed in a through-opening of the circuit board 101.

In one embodiment, each of the first coil 102a and the second coil 102b is disposed in a through-opening of the circuit board 101.

In one embodiment, each of the first coil 102a and the second coil 102b is disposed in a recess of the circuit board 101.

In one embodiment, the plurality of electronic devices 103 comprise at least one active device such as an IC or diode and at least one passive device such as a resistor, capacitor or an inductor.

In one embodiment, the plurality of electronic devices 103 are disposed on a top and/or a bottom surface of the circuit board 101.

Figure 6:
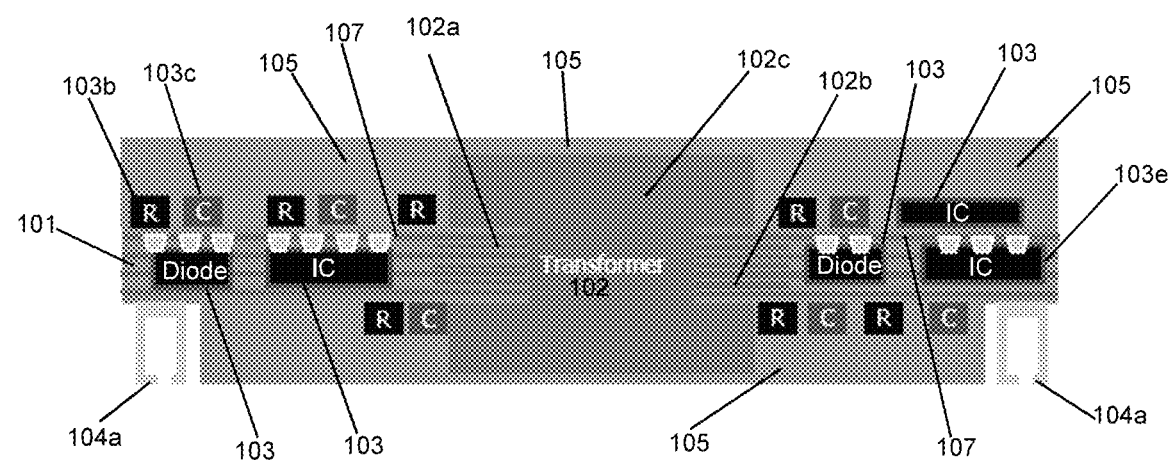
FIG. 6 is a cross-sectional side view of the electronic structure according to one embodiment of the invention.

In one embodiment, at least one portion of the plurality of electronic devices 103 is embedded inside the circuit board 101, as shown in FIG. 6.

In one embodiment, the plurality of electronic devices 103 are entirely embedded inside the circuit board 101.

In one embodiment, the plurality of electronic devices 103 comprise active devices.

In one embodiment, the plurality of electronic devices 103 comprise passive devices.

In one embodiment, the plurality of electronic devices 103 comprise an IC, as shown in FIG. 3, such as a MOSFET.

In one embodiment, the plurality of electronic devices 103 comprise a diode, as shown in FIG. 3.

In one embodiment, the plurality of electronic devices 103 comprise a resistor 103*b*, as shown in FIG. 3.

In one embodiment, the plurality of electronic devices 103 comprise a capacitor 103*c*, as shown in FIG. 3.

In one embodiment, the plurality of electronic devices 103 comprise an inductor.

In one embodiment, a plurality of electrodes 104 are disposed on the circuit board 101 for electrically connecting with an external circuit.

In one embodiment, each of the plurality of electrodes 104 is a surface-mount pad on the circuit board 101 for electrically connecting with an external circuit.

In one embodiment, one portion of the molding body 105 is disposed above the top surface of the circuit board 101, and another portion of the molding body 105 is disposed below the bottom surface of the circuit board 101.

In one embodiment, each of the plurality of electrodes 104 is a conductive pin or a conductive pillar 104*a* disposed on the bottom surface of the circuit board 101 for electrically connecting with an external circuit, as shown in FIG. 3. Please note that the conductive pin or a conductive pillar 104*a* is capable of conducting a large current, wherein the conductive pin or a conductive pillar 104*a* can be surface mounted on an external motherboard. As shown in FIG. 3, the magnetic body 102*c* comprises a bottom part 102*c*B connected to the pillar 102*p* of the magnetic body 102*c* and located below the circuit board 101, wherein a top surface 104*a*T of the conductive pin 104*a* is disposed on a first bottom surface of the circuit board 101, and a bottom surface 104*a*B of the conductive pin 104*a* is lower than a bottom surface 102*c*BS of the bottom part 102*c*B of the magnetic body 102*c*, and a top surface 104*b*T of the conductive pin 104*b* is disposed on a second bottom surface of the circuit board 101, and a bottom surface 104*b*B of the conductive pin 104*b* is lower than the bottom surface 102*c*BS of the bottom part 102*c*B of the magnetic body 102*c*.

Figure 4:
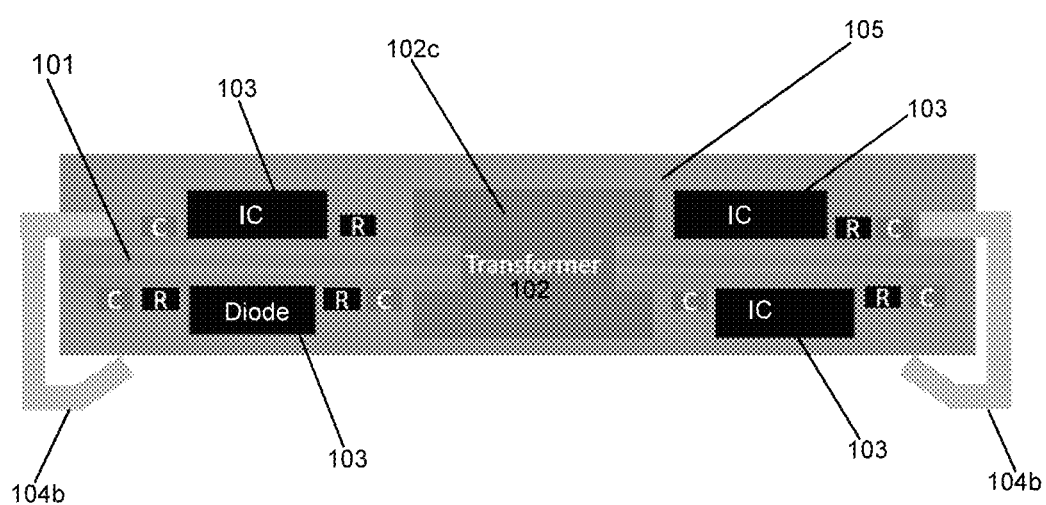
FIG. 4 is a cross-sectional side view of the electronic structure according to one embodiment of the invention.

In one embodiment, each of the plurality of electrodes 104 is a lead frame 104*b* disposed on the circuit board 101 for electrically connecting with an external circuit, as shown in FIG. 4. Please note that the lead frame 104*b* is capable of conducting a large current.

Figure 5:
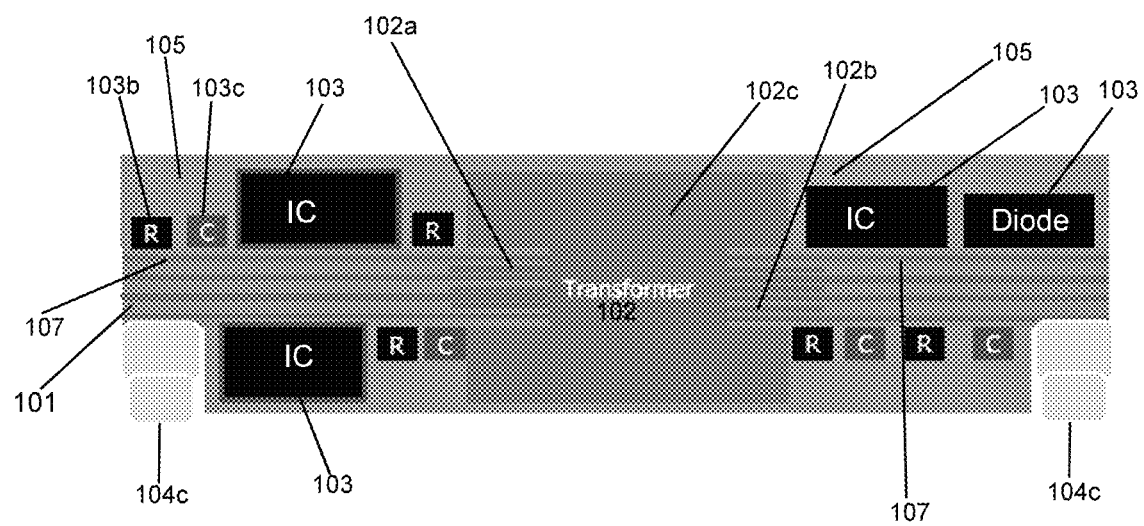
FIG. 5 is a cross-sectional side view of the electronic structure according to one embodiment of the invention.

In one embodiment, each of the plurality of electrodes 104 is a stacked metal bump 104*c* disposed on the circuit board 101 for electrically connecting with an external circuit, as shown in FIG. 5. Please note that the stacked metal bump 104*c* is capable of conducting a large current.

In one embodiment, the molding body 105 encapsulates at least one portion of the magnetic body 102*c* of the transformer 102.

In one embodiment, the molding body 105 encapsulates the entire magnetic body 102*c* of the transformer 102, as shown in FIG. 5.

In one embodiment, one portion of the magnetic body 102*c* of the transformer 102 is disposed below the bottom surface of the molding body 105, and another portion of the magnetic body 102*c* of the transformer 102 is disposed above the top surface of the molding body 105, as shown in FIG. 7. In one embodiment, the first coil 102*a* is disposed in a first through-opening of the circuit board. In one embodiment, the second coil is disposed in a second through-opening of the circuit board. In one embodiment, the first coil 102*a* is disposed in a first recess of the circuit board. In one embodiment, the second coil is disposed in a second recess of the circuit board.

In one embodiment, the circuit board 101 comprises one of the following: a PCB, a BT (Bismaleimide Triazine) substrate, a metallic substrate or a ceramic substrate.

In one embodiment, the electronic structure comprises a multilayer circuit board that comprises the plurality of conductive patterns for forming the first coil 102*a* and the second coil 102*b*.

In one embodiment, the plurality of electronic devices 103 are embedded inside the multilayer circuit board.

In one embodiment, each of the first coil 102*a* and the second coil 102*b* is formed by a conductive wire, as shown in FIG. 7. In one embodiment, the conductive wire comprises a pre-wound coil formed by the conductive wire. In one embodiment, the conductive wire is an insulated conductive wire. In one embodiment, the conductive wire is a round conductive wire. In one embodiment, the conductive wire is a flat conductive wire. In one embodiment, each of the first coil 102*a* and the second coil 102*b* is formed by an enameled wire.

In one embodiment, each of the first coil 102*a* and the second coil 102*b* is disposed in a through-opening of the circuit board 101.

In one embodiment, each of the first coil 102*a* and the second coil 102*b* is disposed in a recess of the circuit board 101.

In one embodiment, the plurality of electronic devices comprise an IC such as a MOSFET.

Figure 8:
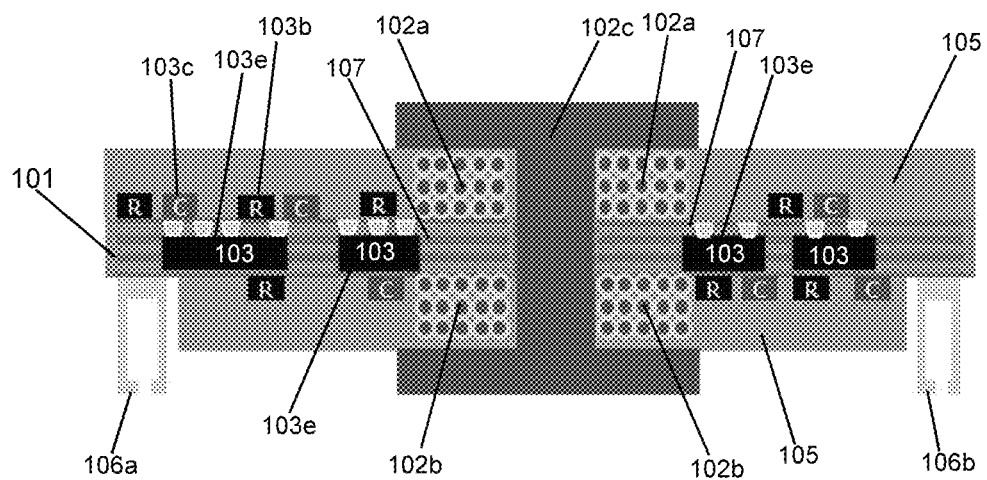
FIG. 8 is a cross-sectional side view of the electronic structure according to one embodiment of the invention.

In one embodiment, at least one portion of the plurality of electronic devices 103, in FIG. 7, is embedded inside the circuit board, as shown in FIG. 8.

In one embodiment, the active devices of the plurality of electronic devices 103, in FIG. 7, are embedded inside the circuit board, as shown in FIG. 8.

In one embodiment, at least one electronic device of the plurality of electronic devices 103 is electrically coupled to the first coil 102*a*; and at least one electronic device of the plurality of electronic devices 103 is electrically coupled to the second coil 102*b*.

Figure 9:
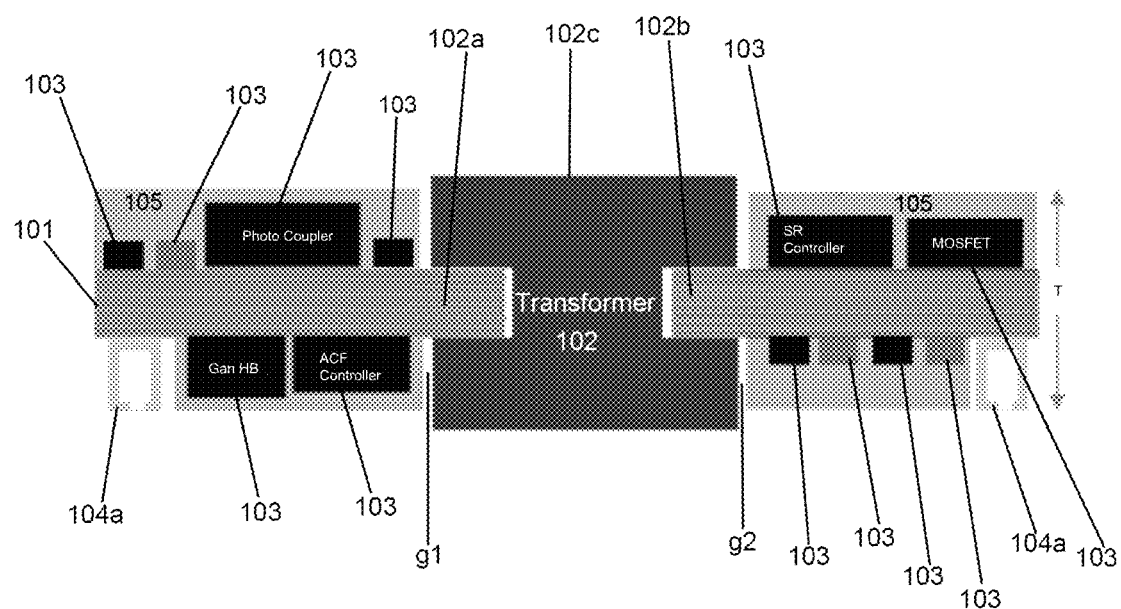
FIG. 9 is a cross-sectional side view of the electronic structure according to one embodiment of the invention.

In one embodiment, the plurality of electronic devices 103 can comprise active electronic devices, and passive devices such as a resistor, a capacitor or an inductor, wherein the active electronic devices can comprises at least one of the following devices: a photo coupler, a Gan (Gallium-nitride) based HB (half bridge), an ACF (advanced adaptive digital) controller, a SR (synchronous rectifier) controller, or a MOSFET, as shown in FIG. 9.

In one embodiment, a photo coupler, a Gan (Gallium-nitride) based HB (half bridge) and an ACF (advanced adaptive digital) controller are electrically coupled to the first coil 102*a*; and a SR (synchronous rectifier) controller and a MOSFET are electrically coupled to the second coil 102*b*, as shown in FIG. 9.

In one embodiment, the molding body 105 encapsulates the plurality of electronic devices 103, a portion of the outer surface of the first coil 102*a* and a portion of the outer surface of the second coil 102*b*, as shown in FIG. 9.

In one embodiment, the molding body 105, which can be made of a molding compound, can have two portions on two opposite sides of the magnetic body 102*c*, as shown in FIG. 9. In one embodiment, the molding compound comprises a resin. In one embodiment, the molding compound comprises epoxy.

In one embodiment, the magnetic body 102c and the molding body 105 can be separated by a gap g1, as shown in FIG. 9.

In one embodiment, the magnetic body 102c and the molding body 105 can be separated by a gap g2, as shown in FIG. 9.

In one embodiment, the magnetic body 102c and the molding body 105 can be separated by gaps g1, g2, as shown in FIG. 9.

In one embodiment, the thickness T of the molding body 105, as shown in FIG. 9, is not greater than 10 mm. In one embodiment, the thickness T of the molding body 105 is 8.6 mm.

Figure 10:
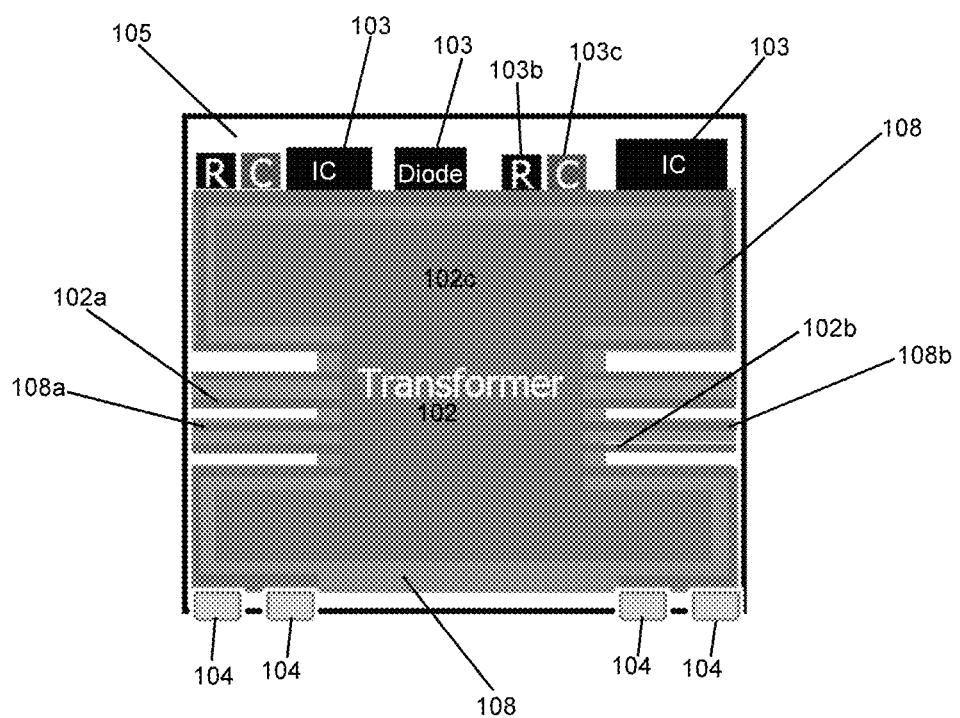
FIG. 10 shows a cross-sectional side view of an electronic structure according to one embodiment of the invention.

In one embodiment, as shown in FIG. 10, the transformer 102 can be formed on a flexible printed circuit board 108, wherein each of the first coil 102a and the second coil 102b is formed by corresponding conductive patterns 108a, 108b of the flexible printed circuit board 108, wherein the magnetic body 102c comprises a first portion disposed in a first hollow space of the first coil 102a and a second portion in a second hollow space of the second coil 102b for forming the transformer 102, wherein the transformer 102 formed on a flexible printed circuit board 108 can be disposed on the circuit board 101 as an integrated component, wherein the flexible printed circuit board 108 is electrically connected to the circuit board 101.

In one embodiment, as shown in FIG. 10, the transformer can be formed on a flexible printed circuit board 108, wherein each of the first coil 102a and the second coil 102b is formed by corresponding conductive patterns 108a, 108b of the flexible printed circuit board 108, wherein the magnetic body 102c comprises a first portion disposed in a first hollow space of the first coil 102a and a second portion in a second hollow space of the second coil 102b for forming the transformer 102.

In one embodiment, a plurality of electronic devices 103 can be disposed on the flexible printed circuit board 108.

In one embodiment, a molding body 105 is disposed on the flexible printed circuit board 108 to encapsulate at least one portion of the outer surface of the first coil 102a, at least one portion of the outer surface of the second coil 102b and the plurality of electronic devices 103 for electrically isolating the plurality of electronic devices 103 from the transformer 102.

In one embodiment, the molding body 105 encapsulates at least one portion of the magnetic body 102c of the transformer 102.

In one embodiment, the molding body 105 encapsulates the entire magnetic body 102c of the transformer 102.

In one embodiment, the flexible printed circuit board 108 is a multilayer circuit board, wherein the first coil 102a comprises corresponding conductive patterns 108a on each layer of the multilayer flexible printed circuit board, wherein the molding body 105 encapsulates the corresponding conductive patterns 108a on each layer of the multilayer flexible printed circuit board.

In one embodiment, as shown in FIG. 3, an electronic structure is disclosed, wherein the electronic structure comprises: a circuit board 101a, wherein a plurality of electronic devices 103 and a transformer 102 are disposed on the circuit board 101, wherein the transformer 102 comprises a first coil 102a, a second coil 102b, and a magnetic body 102c, wherein the magnetic body 102c comprises a first portion disposed in a first hollow space of the first coil 102a and a second portion in a second hollow space of the second coil 102b for forming the transformer 102, wherein each of the first coil 102a and the second coil 102b is formed by corresponding conductive patterns of a plurality of conductive layers of the circuit board 101a.

Figure 11:
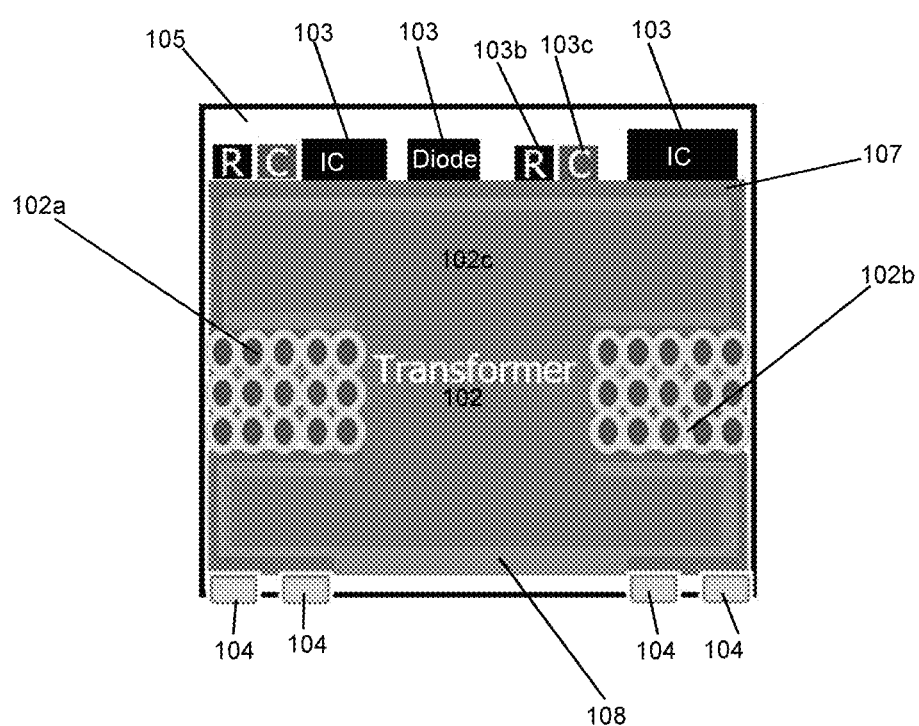
FIG. 11 shows a cross-sectional side view of an electronic structure according to one embodiment of the invention.

In one embodiment, as shown in FIG. 10 and FIG. 11, a transformer is disclosed, wherein the transformer 102 comprises: a first coil 102a and a second coil 102b and a magnetic body 102c, wherein each of the first coil 102a and the second coil 102b is disposed on the flexible printed circuit board 108, wherein the magnetic body 102c comprises a first portion disposed in a first hollow space of the first coil 102a and a second portion in a second hollow space of the second coil 102b for forming the transformer 102.

In one embodiment, each of the first coil 102a and the second coil 102b is formed by corresponding conductive patterns of the flexible printed circuit board 108, as shown in FIG. 10.

In one embodiment, each of the first coil 102a and the second coil 102b is formed by a corresponding conductive wire, as shown in FIG. 11.

In one embodiment, the flexible printed circuit board 108 comprises a plurality of conductive patterns to electrically connect the first coil 102a to at least one portion of the plurality of the electronic devices 103.

In one embodiment, the flexible printed circuit board 108 comprises a plurality of conductive patterns to electrically connect the second coil 102b to at least one portion of the plurality of the electronic devices 103.

In one embodiment, the first coil 102a comprises a first plurality of conductive patterns on the top surface of the flexible printed circuit board 108 and a second plurality of conductive patterns on the bottom surface of the flexible printed circuit board 108, wherein the molding body 105 encapsulates the first plurality of conductive patterns and the second plurality of conductive patterns.

In one embodiment, as shown in FIG. 10 and FIG. 11, an electronic structure is disclosed, wherein the electronic structure comprises a transformer 102 formed on a flexible printed circuit board 108 and a plurality of electronic devices 103 that are disposed on the flexible printed circuit board 108, wherein the transformer 102a comprises a first coil 102a, a second coil 102b, and a magnetic body 102c, wherein the molding body 105 encapsulates at least one portion of the outer surface of the first coil 102a, at least one portion of the outer surface of the second coil 102b and the plurality of electronic devices 103 for electrically isolating the plurality of electronic devices 103 from the transformer 102.

In one embodiment, each of the first coil 102a and the second coil 102b is formed by corresponding conductive patterns of the flexible printed circuit board, as shown in FIG. 10.

In one embodiment, each of the first coil 102a and the second coil 102b is formed by a corresponding conductive wire, as shown in FIG. 11.

In one embodiment, the molding body 105 encapsulates the entire outer surface of the first coil 102a and the entire outer surface of the second coil 102b.

In one embodiment, the molding body 105 encapsulates the entire outer surface of the magnetic body 102c of the transformer 102 formed on the flexible printed circuit board 108.

In one embodiment, the flexible printed circuit board 108 comprises a plurality of conductive patterns 107 to electrically connect the first coil 102a and at least one portion of the plurality of the electronic devices 103.

In one embodiment, the flexible printed circuit board 108 comprises a plurality of conductive patterns 107 to electrically connect the second coil 102b and at least one portion of the plurality of the electronic devices 103.

In one embodiment, the first coil 102a comprises a first plurality of conductive patterns on the top surface of the flexible printed circuit board 108 and a second plurality of conductive patterns on the bottom surface of the flexible printed circuit board 108, wherein the molding body 105 encapsulates the first plurality of conductive patterns and the second plurality of conductive patterns.

In one embodiment, as shown in FIG. 10, a transformer is disclosed, wherein the transformer 102 comprises: a flexible printed circuit board 108, wherein a first coil 102a and a second coil 102b are formed by corresponding conductive patterns of the flexible printed circuit board 108, wherein a magnetic body 102c comprises a first portion disposed in a first hollow space of the first coil 102a and a second portion in a second hollow space of the second coil 102b for forming the transformer 102.

In one embodiment, the first coil 102a comprises a first plurality of conductive patterns on the top surface of the flexible printed circuit board 108 and a second plurality of conductive patterns on the bottom surface of the flexible printed circuit board 108, wherein the molding body 105 encapsulates the first plurality of conductive patterns and the second plurality of conductive patterns.

In one embodiment, the outer surface of the first coil 102 and the outer surface of the second coil 102b are entirely encapsulated in the molding body 105.

In one embodiment, the first coil 102a comprises a first plurality of conductive patterns on the top surface of the flexible printed circuit board 108 and a second plurality of conductive patterns on the bottom surface of the flexible printed circuit board 108, wherein the molding body 105 encapsulates the first plurality of conductive patterns and the second plurality of conductive patterns.

In one embodiment, the flexible printed circuit board 108 comprises a plurality of conductive patterns 107 on the circuit board 101 to electrically connect the first coil 102a and the plurality of the electronic devices 103.

In one embodiment, the flexible printed circuit board 108 comprises a plurality of electrodes 104 for electrically connect with an external circuit.

From the foregoing, it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. An electronic structure, comprising: a circuit board, wherein a plurality of electronic devices and a transformer are disposed on the circuit board, wherein the transformer comprises a first coil, a second coil, and a magnetic body comprising a pillar with at least one portion of the pillar being disposed in a through-opening of the circuit board, wherein the first coil is wound around an upper portion of the pillar and the second coil is wound around a lower portion of the pillar for forming the transformer, wherein the magnetic body comprises a bottom part connected to the lower portion of the pillar and located below the circuit board, wherein the electronic structure further comprises a first conductive pin, wherein a top surface of the first conductive pin is disposed on a first bottom surface of the circuit board, and a bottom surface of the first conductive pin is lower than a bottom surface of the bottom part of the magnetic body.

2. The electronic structure as claimed in claim 1, wherein the first coil comprises a first plurality of winding turns, and the second coil comprises a second plurality of winding turns, wherein the electronic structure further comprises a second conductive pin, wherein a top surface of the second conductive pin is disposed on a second bottom surface of the circuit board, and a bottom surface of the second conductive pin is lower than the bottom surface of the bottom part of the magnetic body, wherein the first conductive pin and the second conductive pin are located at two opposite sides of the magnetic body.

3. The electronic structure as claimed in claim 1, wherein the first coil is formed by a first plurality of conductive patterns of the circuit board.

4. The electronic structure as claimed in claim 3, wherein the second coil is formed by a second plurality of conductive patterns of the circuit board.

5. The electronic structure as claimed in claim 4, wherein the circuit board comprises at least one third conductive pattern to electrically connect the first coil and at least one electronic device of the plurality of the electronic devices.

6. The electronic structure as claimed in claim 4, wherein the first coil comprises at least one first conductive pattern on the top surface of the circuit board.

7. The electronic structure as claimed in claim 6, wherein the second coil comprises at least one second conductive pattern on the bottom surface of the circuit board.

8. The electronic structure as claimed in claim 1, wherein the circuit board comprises one of the following: a PCB, BT (Bismaleimide Triazine) substrate, metallic substrate or ceramic substrate.

9. The electronic structure as claimed in claim 1, wherein the plurality of electronic devices are embedded inside the circuit board.

10. The electronic structure as claimed in claim 1, wherein the first coil is formed by a first discrete conducting wire.

11. The electronic structure as claimed in claim 10, wherein the second coil is formed by a second discrete conducting wire.

12. The electronic structure as claimed in claim 11, wherein the circuit board comprises at least one first conductive pattern to electrically connect the first coil and at least one first electronic device of the plurality of the electronic devices.

13. The electronic structure as claimed in claim 12, wherein the circuit board comprises at least one second conductive pattern to electrically connect the second coil and at least one second electronic device of the plurality of the electronic devices.

14. The electronic structure as claimed in claim 11, wherein the first coil comprises a first plurality of winding turns, and the second coil comprises a second plurality of winding turns.

15. The electronic structure as claimed in claim 1, wherein the circuit board is a multilayer circuit board, wherein each of the first coil and the second coil is formed by corresponding conductive patterns of the multilayer circuit board.

16. The electronic structure as claimed in claim 1, wherein at least one electronic device of the plurality of electronic devices is electrically coupled to the first coil, and at least one electronic device of the plurality of electronic devices is electrically coupled to the second coil.

17. The electronic structure as claimed in claim 1, wherein the plurality of electronic devices comprise active electronic devices and passive devices.

18. The electronic structure as claimed in claim 1, wherein the circuit board is a flexible printed circuit board, wherein at least one portion of the pillar is disposed in a through-opening of the flexible printed circuit board.

19. The electronic structure as claimed in claim 18, wherein each of the first coil and the second coil is formed by corresponding conductive patterns of the flexible printed circuit board.

20. The electronic structure as claimed in claim 19, wherein the flexible circuit board is a multilayer flexible printed circuit board.

* * * * *